United States Patent
Dohle et al.

(10) Patent No.: US 8,923,005 B2
(45) Date of Patent: Dec. 30, 2014

(54) ELECTRICAL COMPONENT HAVING AN ELECTRICAL CONNECTION ARRANGEMENT AND METHOD FOR THE MANUFACTURE THEREOF

(75) Inventors: Rainer Dohle, Kesseldorf (DE); Florian Schuessler, Erlangen (DE); Rolf Diehm, Wertheim (DE); Oliver Kessling, Landshut (DE); Thomas Oppert, Berlin (DE)

(73) Assignee: Micro Systems Engineering GmbH, Berg (DE)

( * ) Notice: Subject to any disclaimer, the term of this patent is extended or adjusted under 35 U.S.C. 154(b) by 230 days.

(21) Appl. No.: 13/400,342

(22) Filed: Feb. 20, 2012

(65) Prior Publication Data

US 2012/0212918 A1    Aug. 23, 2012

Related U.S. Application Data

(60) Provisional application No. 61/445,055, filed on Feb. 22, 2011.

(30) Foreign Application Priority Data

Feb. 22, 2011    (DE) .................. 10 2011 000 866

(51) Int. Cl.
| | |
|---|---|
| *H05K 7/00* | (2006.01) |
| *H01L 23/28* | (2006.01) |
| *H01L 23/498* | (2006.01) |
| *H01L 21/56* | (2006.01) |
| *H01L 23/00* | (2006.01) |

(52) U.S. Cl.
CPC ........ *H01L 23/49816* (2013.01); *H01L 21/563* (2013.01); *H01L 24/81* (2013.01); *H01L 24/83* (2013.01); *H01L 24/14* (2013.01);

(Continued)

(58) Field of Classification Search
CPC combination set(s) only.
See application file for complete search history.

(56) References Cited

U.S. PATENT DOCUMENTS

| | | |
|---|---|---|
| 5,056,215 A | 10/1991 | Blanton |
| 5,953,814 A | 9/1999 | Sozansky et al. |

(Continued)

FOREIGN PATENT DOCUMENTS

| | | |
|---|---|---|
| DE | 299 19 245 | 3/2000 |
| DE | 10 2009 009 828 | 9/2010 |

(Continued)

OTHER PUBLICATIONS

European Search Report and Notes to the European Search Report on European Patent Application No. EP 12 154 832, dated Mar. 20, 2012 (8 pages).

*Primary Examiner* — Hoa C Nguyen
*Assistant Examiner* — Xanthia C Cunningham
(74) *Attorney, Agent, or Firm* — Buchanan Ingersoll & Rooney PC

(57) ABSTRACT

An electrical component and a method for the manufacture thereof, comprising a connection arrangement between an active surface of an electrical component and a carrier, wherein electrical connecting elements are disposed in a connection zone on the active surface and/or on the carrier, and at least one spacer element is provided, which is disposed on the active surface and/or on the carrier. The at least one spacer element has a smaller height than the connecting elements before the connecting elements are reflowed to produce the electrically conductive connection, and is preferably disposed in an edge region of the connection zone.

11 Claims, 3 Drawing Sheets

(52) U.S. Cl.
CPC ............... *H01L 2224/73204* (2013.01); *H01L 2224/81139* (2013.01); *H01L 2224/83192* (2013.01); *H01L 2924/01004* (2013.01); *H01L 2924/01013* (2013.01); *H01L 2924/01029* (2013.01); *H01L 2924/01047* (2013.01); *H01L 2924/01079* (2013.01); *H01L 2924/01082* (2013.01); *H01L 2924/01005* (2013.01); *H01L 2924/01006* (2013.01); *H01L 2924/01033* (2013.01); *H01L 2924/0105* (2013.01); *H01L 2924/01322* (2013.01); *H01L 2924/014* (2013.01); *H01L 2224/16225* (2013.01); *H01L 2224/32225* (2013.01); *H01L 2224/29324* (2013.01); *H01L 2224/81902* (2013.01); *H01L 24/13* (2013.01); *H01L 24/16* (2013.01); *H01L 2224/10135* (2013.01); *H01L 2224/131* (2013.01); *H01L 2224/13111* (2013.01); *H01L 2224/13144* (2013.01); *H01L 2224/1319* (2013.01); *H01L 2224/1403* (2013.01); *H01L 2224/14505* (2013.01); *H01L 2224/16227* (2013.01); *H01L 2224/2929* (2013.01); *H01L 2224/29388* (2013.01); *H01L 2224/81191* (2013.01); *H01L 2224/81204* (2013.01); *H01L 2224/81815* (2013.01); *H01L 2224/83204* (2013.01); *H01L 2224/83862* (2013.01); *H01L 2224/9211* (2013.01); *H01L 2924/00013* (2013.01)
USPC ....................................... 361/760; 257/787

(56) References Cited

U.S. PATENT DOCUMENTS

| | | | |
|---|---|---|---|
| 6,287,895 B1 | 9/2001 | Sato | |
| 6,367,150 B1 | 4/2002 | Kirsten | |
| 6,768,401 B2* | 7/2004 | Koriyama | 333/248 |
| 7,109,061 B2* | 9/2006 | Crane et al. | 438/118 |
| 7,622,325 B2* | 11/2009 | Shim et al. | 438/106 |
| 7,749,887 B2* | 7/2010 | Lee | 438/612 |
| 2002/0066594 A1* | 6/2002 | Shintani et al. | 174/261 |
| 2002/0089067 A1* | 7/2002 | Crane et al. | 257/778 |
| 2005/0151246 A1* | 7/2005 | Daeche et al. | 257/723 |
| 2005/0218528 A1* | 10/2005 | Beatty et al. | 257/778 |
| 2006/0192295 A1* | 8/2006 | Lee et al. | 257/778 |
| 2006/0208030 A1* | 9/2006 | Caletka et al. | 228/41 |
| 2007/0172981 A1 | 7/2007 | Wang et al. | |
| 2007/0181992 A1 | 8/2007 | Lake | |
| 2007/0235217 A1 | 10/2007 | Workman | |
| 2008/0142940 A1* | 6/2008 | Dunne | 257/686 |
| 2008/0251943 A1* | 10/2008 | Corisis et al. | 257/778 |
| 2008/0253098 A1* | 10/2008 | Liu | 361/771 |
| 2008/0316721 A1* | 12/2008 | Maki | 361/760 |
| 2009/0085227 A1* | 4/2009 | Shiraishi et al. | 257/778 |
| 2009/0151972 A1* | 6/2009 | Potter | 174/50.5 |
| 2009/0206468 A1* | 8/2009 | Kang et al. | 257/690 |
| 2009/0243065 A1* | 10/2009 | Sugino et al. | 257/686 |
| 2010/0025862 A1* | 2/2010 | Gruber et al. | 257/778 |
| 2012/0212918 A1* | 8/2012 | Dohle et al. | 361/770 |

FOREIGN PATENT DOCUMENTS

| | | |
|---|---|---|
| EP | 1 463 103 | 9/2004 |
| JP | 5 218134 | 8/1993 |
| WO | 2008073432 | 6/2008 |

* cited by examiner

ELECTRICAL COMPONENT HAVING AN ELECTRICAL CONNECTION ARRANGEMENT AND METHOD FOR THE MANUFACTURE THEREOF

CROSS-REFERENCE TO RELATED APPLICATIONS

This patent application claims the priority of co-pending German Patent Application No. DE 10 2011 000 866.7, filed on Feb. 22, 2011 in the German Patent Office, and co-pending U.S. Provisional Patent Application No. 61/445,055, filed on Feb. 22, 2011 in the U.S. Patent Office, the disclosures of which are hereby incorporated by reference in their entirety.

TECHNICAL FIELD

The present invention relates generally to an electrical component or an electrical assembly such as, for example, a multi-chip module having an electrical connection arrangement, and also to a method for the manufacture thereof, according to the preambles of the independent claim(s).

BACKGROUND

Devices having surface-mounted electrical components typically comprise a carrier, e.g., a printed circuit board, and one or more unhoused electrical components such as, for example, chips or electrical units which are disposed on the carrier and are electrically connected to the electrical conductors of the carrier. Wireless connections such as surface mounting, for example, are used to reduce the dimensions of the device. In the case of such SMD components (SMD=surface mounted device), bonding wires are not used to produce the electrical connection between contact areas of the electrical components and corresponding electrical conductor lands of the carrier. Instead, the electrical connection is produced between the electrical components and the carrier by way of a soldered connection using solder balls (often called "bumps") between the contact area of the electrical components and the corresponding conductor land on the carrier.

Known devices that do not have bonding wires are "flip chips", for example, in which the chip is mounted directly with the active contact side facing the carrier. Particularly small dimensions and short conductor lengths can therefore be attained by the use of electrically conductive bumps. In highly complex circuits, this technology is often the only reasonable way to produce connections, and can be used to create several thousand contacts, for instance, wherein the electrical connection is produced across all contacts simultaneously. Advantageously, the entire surface of the chip can be used for contacting. Various processes are used to produce a permanent electrical connection by way of the bumps, such as soldering, conductive bonding, pressure welding, and the like.

One problem associated with such devices is that of setting a defined distance between the surface-mounted electrical component and the carrier.

International Publication No. WO 2008/073432 makes known a remelt soldering process, in which a holding element with solder is used to press an electrical component onto a carrier. A filler of the no-flow underfill type, which contains spacers that enable a defined distance to be set between the electrical component and the carrier, is used for this purpose.

U.S. Publication No. 2007/0181992 makes known a method for connecting two chips, in the case of which solder balls (bumps) and a filler are applied onto the chip. Spacer elements are added to the filler to ensure that a required distance between the chips is set when the solder balls are reflowed to produce the electrical connection. The filler can be of the no-flow underfill type. For this purpose, the spacers are embedded in a fluid matrix which can be applied locally or over a large surface area.

U.S. Publication No. 2007/0235217 discloses a method, in the case of which polymer spacers are applied to the carrier surface and/or the surface of the electrical component, which ensure that the minimum distance is set when the surface-mounted electrical component and the carrier are connected. The electrical component with the solder balls thereof disposed on the contact areas is placed on the conductor lands of the carrier with positional accuracy, wherein the intermediate space can be filled with a filler, in particular, a no-flow underfill. The assembly is heated until the solder bumps are reflowed and a metallic connection is produced between the contact areas of the electrical component and the conductor lands of the carrier. A required distance is thereby set by way of the spacers.

Devices having very small solder bumps, e.g., with diameters of less than 100 μm, have the problem, however, that the electrical component can float on top of the filler or, if excessive contact force is applied during connecting, the distance between the electrical component and the carrier becomes too small since the filler is displaced laterally, thereby affecting the reliability of the structure or even enabling short circuits to occur between adjacent solder balls.

A problem addressed by the present invention is that of providing a method, by way of which the electrical component can be prevented from floating on top of the filler. Furthermore, a connection arrangement shall be provided, which has small solder balls in particular, and the reliability of which is improved.

The present inventive disclosure is directed toward overcoming one or more of the above-identified problems.

SUMMARY

A problem is solved according to the present invention by the features of the independent claim(s). Favorable embodiments and advantages of the present invention will be apparent from the further claims and the description.

An electrical component is provided which comprises a connection arrangement between an active surface of an electrical component and a carrier, wherein electrical connecting elements are disposed in a connection zone on the active surface and/or on the carrier, and at least one spacer element is provided which is disposed on the active surface and/or on the carrier. The at least one spacer element has a shorter height, in particular, a significantly shorter height, than the connecting elements before the connecting elements are reflowed to produce the electrically conductive connection, and the at least one spacer element is preferably disposed in an edge region of the connection zone.

Particularly advantageously, the at least one spacer element can be disposed in a corner of the connecting region if the cross section thereof is polygonal. Advantageously, spacer elements are disposed in every corner of the connecting region. In particular, solder balls in the corners can be replaced by one spacer element each. The spacer element can be metallically conductive. In a favorable embodiment, the connecting elements and/or spacer elements can both be formed of a soft solder, wherein the solder of the spacer elements has a higher melting point than the solder of the connecting elements.

Advantageously, the at least one spacer element has a higher melting temperature than the electrical connecting elements, thereby ensuring that a stable minimum distance can be maintained in the process of joining the electrical component and the carrier.

In particular, the electrical connecting elements can be balls formed out of solder, which can be applied onto the carrier and/or the electrical component using conventional methods, e.g., balling using "gang ball placement", the C4NP technique (C4NP=Controlled Collapse Chip Connection New Process), solder paste printing, reflowing the solder paste, and the like.

As used herein, the active surface of the electrical component refers, in particular, to the surface on which contact areas are provided for the electrical contacting of the electrical component from the outside. An electrical component preferably refers to a component which has at least one electrical structure, such as, for example, a conducting track or an electronic circuit. In particular, the electrical component comprises a substrate on which one or more such structures are formed.

The electrical component can comprise highly diverse elements, such as, for example, flip chips, structures having the dimensions of a chip, diodes, coils, capacitors, resistors, varistors, optoelectrical components, and the like.

A connecting region refers, in particular, to the region in which contact areas on the active surface of the electrical component and conductor lands of the carrier are to be interconnected.

An edge region refers, in particular, to a region of the connecting region disposed outside of the center of the connecting region.

According to a favorable embodiment of the present invention, the at least one spacer element can have a height that is at least 10% lower, preferably at least 20% lower, and particularly preferably at least 50% lower, than that of the connecting elements before the connecting elements are reflowed to produce the electrically conductive connection. Advantageously, sufficient pressure can be applied onto a filler to spread it as evenly as possible in the connection zone.

According to a favorable embodiment of the present invention, the at least one spacer element can comprise a solder material and/or a polymer. In the embodiment as a solder material, an electrical connection can be produced by way of the spacer element. In the embodiment as a polymer, the spacer element can provide electrical insulation or, in combination with electrodes on the connecting partners, can have capacitance and thereby form a capacitor.

According to a favorable embodiment of the present invention, the at least one spacer element can have a maximum height of 50 µm, preferably 40 µm, and particularly preferably 35 µm. Advantageously, the diameter of the electrical connecting elements that is present before the solder is reflowed can be approximately twice as great as the height of the at least one spacer. In particular, the electrical connecting elements can have a maximum diameter of 100 µm, preferably 80 µm, particularly preferably 70 µm, and very particularly preferably 60 µm.

According to a favorable embodiment of the present invention, the at least one spacer element and the electrical connecting elements can be embedded in a filler which is, in particular, non-flow. The filler of the no-flow underfill type is used advantageously to protect the intermediate space between the electrical component and the carrier, and can hermetically seal them. The component can therefore be used in a moist or liquid environment, for example. In addition, the thermal shock resistance of the structure is improved. The component can also comprise an external encapsulation which is provided or filled with a polymer, e.g., epoxy resin having silicon dioxide, aluminum oxide, and/or aluminum nitride particles, or a material having similar material properties.

According to a favorable embodiment of the present invention, the electrical connecting elements can be formed of a tin-silver-copper solder. Advantageously, the at least one spacer element can be comprised of an eutectic gold-tin solder. The melting point of the eutectic gold-tin solder is approximately 280° C., and is higher than the melting point of the tin-silver-copper solder, which is approximately 220° C.

According to a further aspect of the present invention, a method for manufacturing an electrical component is provided, comprising an electrical connection arrangement between an active surface of an electrical component and a carrier, having the following method steps:

Providing the electrical component and the carrier, wherein the active surface and/or the carrier are equipped with a plurality of electrical connecting elements and at least one spacer element;

Applying a filler onto the carrier and/or the active surface in the region of the electrical connecting element and the at least one spacer element;

Joining the electrical component and the carrier;

Activating the filler;

Reflowing the connecting elements;

Placing the at least one spacer element on the contact area intended therefore; and Curing the filler and/or the electrical connecting elements.

Advantageously, the electrical component can be prevented from floating on top of the filler even when the electrical connecting elements have small dimensions.

According to a favorable embodiment of the present invention, the filler can be dispensed into the center of the connection zone. In particular, the filler can be applied such that it is thicker in the center when applied, with the thickness decreasing toward the outside. The quantity of the filler can be dispensed in such a manner that ensures that the desired intermediate space between the electrical component and the carrier is filled.

According to a favorable embodiment of the present invention, when the electrical component and the carrier are joined, a contact pressure can be applied, thereby enabling the filler to spread underneath the electrical component.

According to a favorable embodiment of the present invention, before the electrical component and the carrier are provided, one or more empty spaces for the at least one spacer element can be provided simultaneously with the application of the electrical connecting element. Advantageously, during the simultaneous application of the electrical connecting element onto the carrier and/or the active surface, one or more solder balls can be left out, and more advantageously solder balls in the corners or in the vicinity of corners of the area to be provided with solder balls can be left out. Next, one or more spacer elements can be placed onto the empty spaces, using solder jetting, for example, in which case a solder ball is delivered by way of a capillary and is reflowed using a laser beam, or liquid solder is ejected out of a supply container through a cannula, solder sphere placement, or the like. In addition, or as an alternative thereto, the at least one spacer element can be disposed in any position in the connecting region.

According to a favorable embodiment of the present invention, the electrical component and the carrier can be joined at an elevated temperature of between approximately 30° C. and 80° C. Advantageously, high contact pressure can be applied, thereby enabling the filler to spread underneath the electrical component as evenly as possible and, therefore, the electrical connecting elements rest on their intended contact areas. The temperature can be raised further until the electrical connecting elements reflow and the electrical components now rest on the at least one spacer element, e.g. on the spacer elements in the corner positions, and the filler is displaced to the edges of the connecting region.

According to a favorable embodiment of the present invention, the filler can be thermally activated. Advantageously, a temperature is used at which a flux contained in the filler becomes active and any undesired metal oxides are removed from the contact areas of the electrical components and the conductor lands of the carrier, thereby making it possible to produce a low-resistance electrical connection. Other activation techniques are also feasible, e.g., using UV radiation and the like.

According to a favorable embodiment of the present invention, the filler can be cured at an elevated temperature and contact pressure. The interconnected assembly is thereby stabilized.

According to a favorable embodiment of the present invention, the electrical connecting elements can be cured at an elevated temperature and with the application of contact pressure. The interconnected assembly is thereby stabilized.

The present invention is suited in particular for an electrical component which is intended for use as an implant in a human body or an animal body.

Various other objects, aspects and advantages of the present inventive disclosure can be obtained from a study of the specification, the drawings, and the appended claims.

DESCRIPTION OF THE DRAWINGS

The present invention is explained in the following in greater detail as an example, with reference to an embodiment depicted in drawings. They show, in a diagrammatic representation.

DETAILED DESCRIPTION

Figure 1:
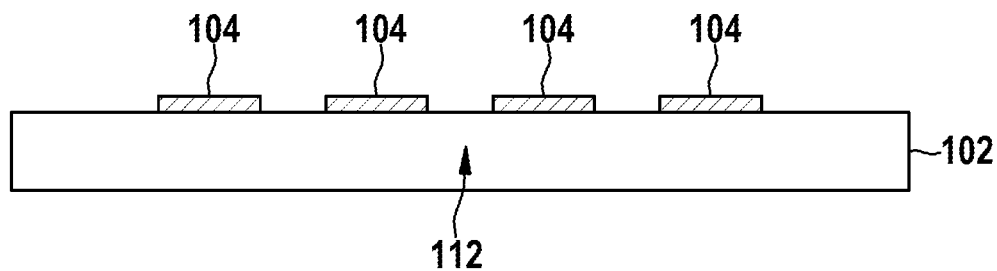
FIG. 1 shows a carrier having conductor lands for connecting an electrical component.

Elements that are functionally identical or similar-acting are labeled using the same reference numerals in the Figures. The Figures are schematic depictions of the present invention. They do not depict specific parameters of the present invention. Furthermore, the Figures merely show typical embodiments of the present invention and are not intended to limit the present invention to the embodiments shown.

FIGS. 1-6 illustrate various method steps of an advantageous embodiment of a method according to the present invention for manufacturing an electrical component.

The electrical component comprises a connecting assembly 100 between an active surface 110 of an electrical component 101, e.g., a semiconductor chip, and a carrier 102.

FIG. 1 shows carrier 102, such as, for example, a printed circuit board with printed circuits, with conductor lands 104 on the surface thereof, which are disposed in a connecting region 112.

Figure 2:
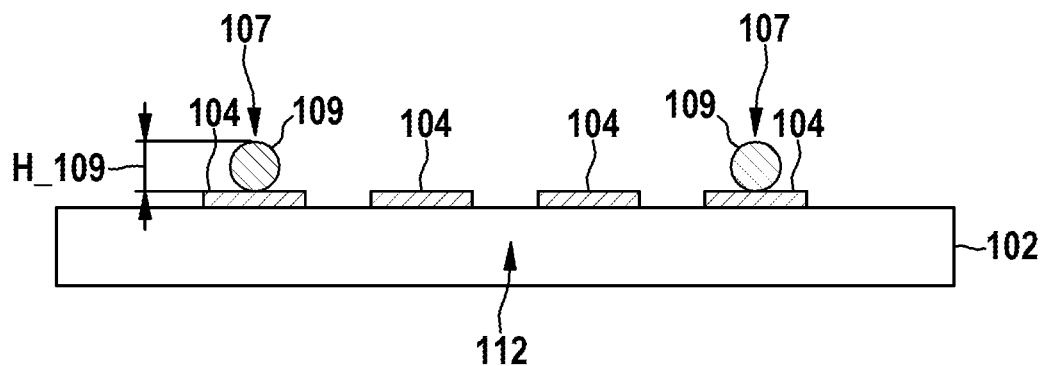
FIG. 2 shows a carrier having conductor lands, wherein spacer elements are disposed on a few conductor lands.

FIG. 2 shows a variant in which spacer elements 109 having a height $H\_109$ are disposed on conductor lands 104 in the edge region of connecting region 112 of carrier 102.

Figure 3:
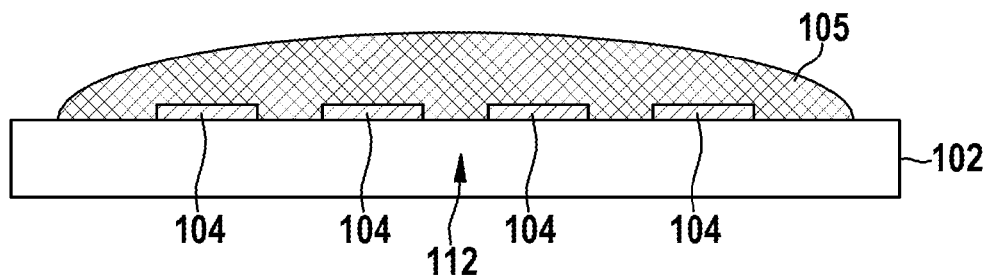
FIG. 3 shows the carrier shown in FIG. 1, on which a filler has been applied over a connecting region having conductor lands.

FIG. 3 shows the carrier depicted in FIG. 1, wherein a filler 105 has been dispensed in the center of connecting region 112. Filler 105 is thicker in the center than in the edge region thereof, and covers conductor lands 104. Filler 105 can be of the no-flow underfill type, in particular. However, the present invention is not limited thereto. A no-flow underfill filler 105 is a polymer comprising a component that acts as a flux, i.e., is reductive on metal oxides, at an elevated temperature, or a plurality of such components. The no-flow underfill material contains particles like, for example, silicon dioxide, aluminum oxide, boron nitride, beryllium oxide, or aluminum nitride with a size of approximately 0.1 to 10 μm.

Figure 4:
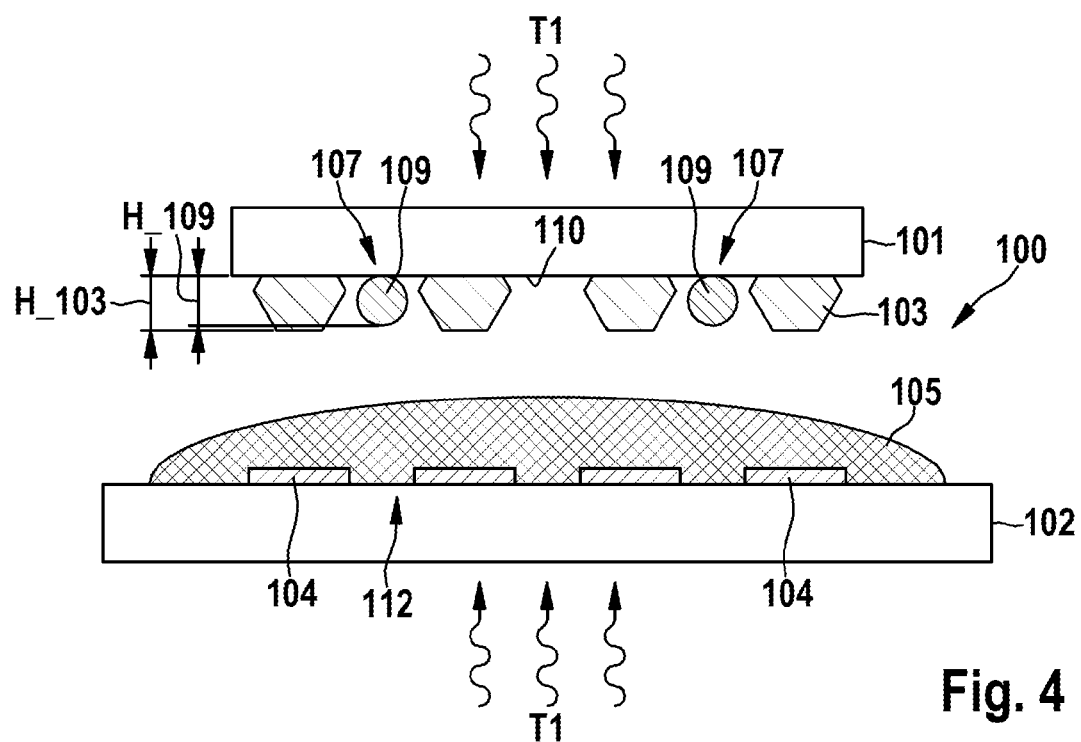
FIG. 4 shows the carrier shown in FIG. 3, over which an electrical component having solder balls and spacer elements is positioned.
Figure 5:
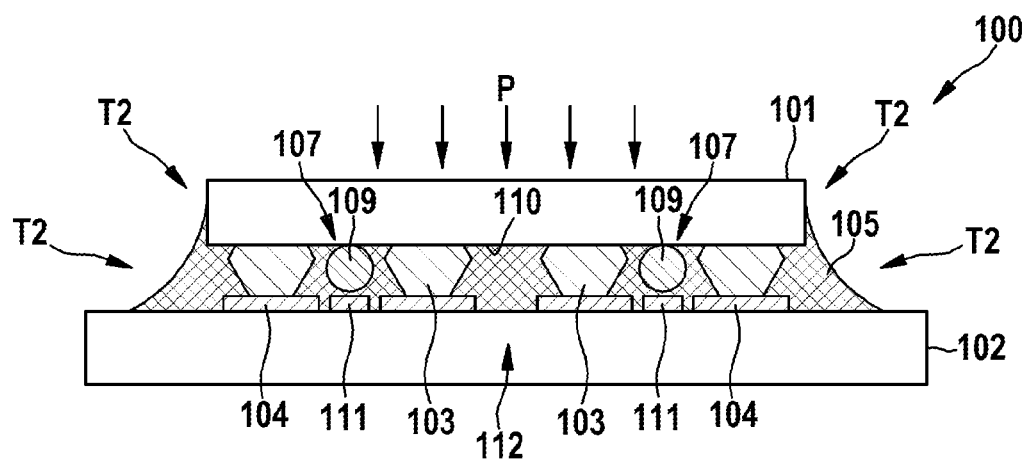
FIG. 5 shows a structure comprised of carrier and electrical component depicted in FIG. 4, as the solder balls are reflowed.

FIG. 4 shows an electrical component 101, e.g., a microelectronic semiconductor chip, the active surface 110 of which faces carrier 102. Active surface 110 comprises electrical connecting elements 103, e.g., solder balls, which are disposed on contact areas (which are understood by those skilled in the art and are not described in greater detail herein) on active surface 110, and the position of which corresponds to that of conductor lands 104 of the carrier.

Spacer elements 109 are disposed in-between electrical connecting elements 103, e.g. in edge region 107 of electrical component 101, height $H\_109$ of which is lower than, and preferably significantly lower than, height $H\_103$ of electrical connecting elements 103 before connecting elements 103 are reflowed to produce the electrically conductive connection. Height $H\_109$ of spacer elements 109 is preferably at least 10% less, particularly preferably at least 20% less, and further preferably at least 50% less, than the height $H\_103$ of electrical connecting elements 103.

The solder balls (connecting elements 103) can be formed, e.g., of lead-free solder, preferably tin-silver-copper solders, such as, for example, SAC305 solder, and have a uniform size within the scope of the manufacturing tolerances. The solder balls can be placed, e.g., as small solder spheres having a diameter of approximately 60 μm, simultaneously onto the contact areas of active surface 110 using gang ball placement, and can be soldered thereto. By way of the simultaneous application of connecting elements 103, which are typically distributed on active surface 110 in a type of matrix, empty spaces for spacer elements 109 can be intentionally created. A few individual spacer elements 109, which are formed, e.g., of small solder spheres of an Au80Sn20 solder, are distributed in edge regions 107 of electrical component 101 close to the corners using selective solder jetting or other similar techniques. These solder spheres have a smaller diameter, of only approximately 40 μm, for example.

Spacer elements 109 can be applied preferably in a sequential process, using solder jetting, for example, in which case a solder sphere is conveyed through a capillary and through a laser beam, or liquid solder in a supply container is ejected through a capillary, or is reflowed simultaneously before or preferably after connecting elements 103.

Of course, electrical connecting elements 103 and/or spacer elements 109 can also be disposed entirely or partially on carrier 102, as illustrated in FIG. 2 for spacer elements 109.

FIG. 4 shows that electronic component 101 is placed precisely such that electrical connecting elements 103 are disposed exactly over intended conductor lands 104.

In this stage of the process, carrier 102 and electrical component 101 can be heated to a first temperature T1. Favorably, temperature T1 is in a range of approximately 30° C. to 80° C.

Electrical component 101, with electrical connecting elements 103 on active surface 110 thereof, is placed onto conductor lands 104 of carrier 102 (see FIG. 5), and is pressed against carrier 102 with a high contact force P. Filler 105 is thereby pressed outwardly and spreads relatively evenly in connection zone 112. Spacer elements 109 are disposed in edge region 107 of electrical component 101 and are still separated from their intended contact areas 111 due to the low height H_109 thereof.

The temperature is increased until a flux contained in filler 105 is activated, and any impurities such as oxides are removed from the contact surfaces and conductor lands 104. The process temperature is between approximately 120° C. and 190° C. in this case. The temperature is increased to a second temperature T2, for example, at which electrical connecting elements 103 reflow and wet the metallization of corresponding contact areas, and therefore electrical components 101 rest by way of spacer elements 109 thereof on corresponding contact areas 111 of carrier 102, and filler 105 is pressed outward toward the edges of electrical component 101.

Figure 6:
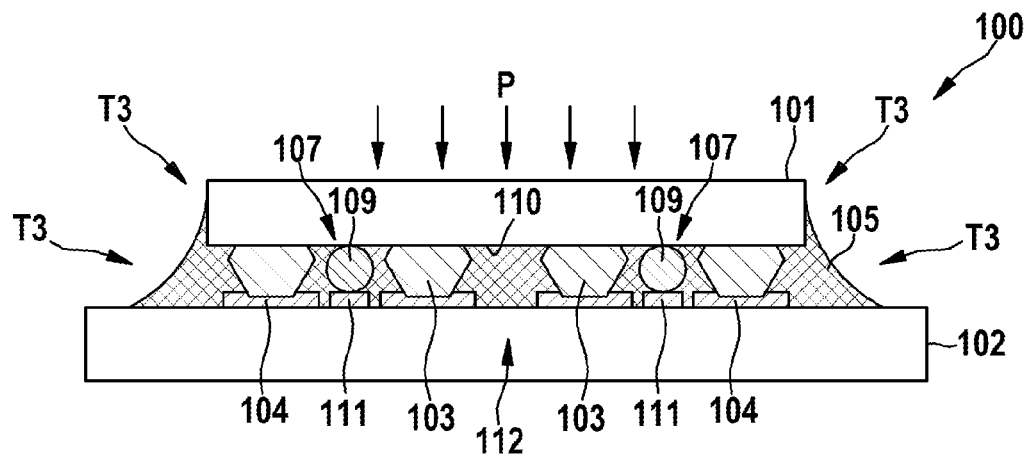
FIG. 6 shows the structure shown in FIG. 5, with cured filler.

Filler 105 is cured while contact pressure P and an elevated temperature T3 are maintained. Next, the assembly is cooled under the contact pressure, and so electrical connecting elements 103 solidify, as depicted in FIG. 6. Temperature T3 can be equal to temperature T2 when electrical connecting elements 103 reflow, or it can be lower, for example. However, the temperature always remains below the melting temperature of spacer elements 109.

The at least one spacer element 109 can be a solder material, in particular, an eutectic gold-tin solder, and/or a polymer, such as, for example, a thermoplastic material or LCP (liquid crystal polymer). Advantageously, spacer element 109 is a soft solder when it is provided in an embodiment as solder material. Electrical connecting elements 103 can be formed of, for example, a tin-silver-copper solder, a tin-silver solder or a tin-copper solder, the melting point of which is below the melting point of spacer elements 109.

Optionally, a material can be applied subsequently to encapsulate the entire assembly.

It will be apparent to those skilled in the art that numerous modifications and variations of the described examples and embodiments are possible in light of the above teachings of the disclosure. The disclosed examples and embodiments are presented for purposes of illustration only. Other alternate embodiments may include some or all of the features disclosed herein. Therefore, it is the intent to cover all such modifications and alternate embodiments as may come within the true scope of this invention, which is to be given the full breadth thereof. Additionally, the disclosure of a range of values is a disclosure of every numerical value within that range.

We claim:

1. An electrical component or electrical assembly comprising:
a connection arrangement between an active surface of an electrical component and a carrier, wherein electrical connecting elements are disposed in a connection zone on the active surface and/or on the carrier; and
at least one spacer element which is disposed on the active surface and/or on the carrier,
wherein the at least one spacer element has a shorter height than the connecting elements before the connecting elements are reflowed to produce the electrically conductive connection,
wherein the at least one spacer element is disposed in an edge region of the connection zone,
wherein the at least one spacer element has a melting point higher than a melting point of the connecting elements;
wherein the at least one spacer element and the connecting elements are embedded in a filler;
wherein the at least one spacer element prevents floating of the electrical component and/or carrier by lateral displacement of the filler when forming the connection arrangement, and ensures a minimum distance is maintained between the electrical component and the carrier when forming the connection arrangement.

2. The electrical component or electrical assembly according to claim 1, wherein the at least one spacer element has a height that is at least 10% shorter than that of the connecting elements.

3. The electrical component or electrical assembly according to claim 1, wherein the at least one spacer element has a height that is at least 20% shorter than that of the connecting elements.

4. The electrical component or electrical assembly according to claim 1, wherein the at least one spacer element has a height that is at least 50% shorter than that of the connecting elements.

5. The electrical component or electrical assembly according to claim 1, wherein the at least one spacer element comprises a solder material and/or a polymer.

6. The electrical component or electrical assembly according to claim 1, wherein the at least one spacer element has a maximum height of approximately 50 μm.

7. The electrical component or electrical assembly according to claim 1, wherein the at least one spacer element has a maximum height of approximately 40 μm.

8. The electrical component or electrical assembly according to claim 1, wherein the at least one spacer element has a maximum height of approximately 35 μm.

9. The electrical component or electrical assembly according to claim 1, wherein the filler comprises a non-flow filler.

10. The electrical component or electrical assembly according to claim 1, wherein the electrical connecting elements are formed of a tin-silver-copper solder, and the at least one spacer element is formed of an eutectic gold-tin solder.

11. The electrical component or electrical assembly according to claim 1, wherein the filler comprises a flux configured to remove metal oxides from portions of the active surface of the electrical component and/or the carrier upon thermal activation.

\* \* \* \* \*